(12) United States Patent
Samejima et al.

(10) Patent No.: US 10,293,574 B2
(45) Date of Patent: May 21, 2019

(54) RESIN MOLDED BODY

(71) Applicant: YAZAKI CORPORATION, Tokyo (JP)

(72) Inventors: Masakuni Samejima, Shizuoka (JP); Takeo Koga, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/703,533

(22) Filed: Sep. 13, 2017

(65) Prior Publication Data

US 2018/0072016 A1    Mar. 15, 2018

(30) Foreign Application Priority Data

Sep. 15, 2016   (JP) ................. 2016-181004

(51) Int. Cl.
| | |
|---|---|
| *B32B 3/30* | (2006.01) |
| *B32B 27/06* | (2006.01) |
| *H01F 5/04* | (2006.01) |
| *H01R 13/50* | (2006.01) |
| *H05K 5/00* | (2006.01) |
| *H02G 3/16* | (2006.01) |

(52) U.S. Cl.
CPC ............... *B32B 3/30* (2013.01); *B32B 27/06* (2013.01); *H01F 5/04* (2013.01); *H01R 13/50* (2013.01); *H05K 5/003* (2013.01); *H05K 5/0034* (2013.01); *H05K 5/0069* (2013.01); *B32B 2457/00* (2013.01); *H02G 3/16* (2013.01); *Y10T 428/24008* (2015.01)

(58) Field of Classification Search
CPC ...... Y10T 428/24008; H02G 3/16; B32B 3/30
See application file for complete search history.

(56) References Cited

U.S. PATENT DOCUMENTS

| | | |
|---|---|---|
| 2013/0033098 A1 | 2/2013 | Nagashima et al. |
| 2015/0156929 A1 | 6/2015 | Nagashima et al. |

FOREIGN PATENT DOCUMENTS

| | | |
|---|---|---|
| DE | 195 45 011 A1 | 4/1997 |
| JP | 2002-13660 A | 1/2002 |
| JP | 2006-50806 A | 2/2006 |
| JP | 2013-35320 A | 2/2013 |
| JP | 2013-62906 A | 4/2013 |
| JP | 2014-7115 A | 1/2014 |

OTHER PUBLICATIONS

Japanese Office Action for the related Japanese Patent Application No. 2016-181004 dated Oct. 30, 2018.
Japanese Office Action for the related Japanese Patent Application No. 2016-181004 dated Mar. 5, 2019.

*Primary Examiner* — Alexander S Thomas
(74) *Attorney, Agent, or Firm* — Kenealy Vaidya LLP

(57) ABSTRACT

A resin molded body includes a connector unit having a side wall and an inner wall, both of which define a fitting chamber to which a mating connector is fitted and having a terminal penetrating through the inner wall and extending in a fitting direction, a substrate accommodating unit accommodating a circuit substrate to which the terminal is connected, and a device accommodating unit accommodating a device connected to the circuit substrate. The resin molded body is an integral molded product made of resin. A connecting portion has a plate shape extending outwards from the inner wall of the connector unit, and a second thickness thinner than a first thickness of the inner wall. The connecting portion is linked to the device accommodating unit.

5 Claims, 7 Drawing Sheets

RESIN MOLDED BODY

CROSS REFERENCE TO RELATED APPLICATIONS

This application claims priority from Japanese Patent Application No. 2016-181004 filed on Sep. 15, 2016, the entire contents of which are incorporated herein by reference.

BACKGROUND OF THE INVENTION

Field of the Invention

The present invention relates to a resin molded body in which a connector unit that has a side wall and an inner wall, which define a fitting chamber, and that has a terminal penetrating through the inner wall and extending in a fitting direction, a substrate accommodating unit that accommodates a circuit substrate to which the terminal is connected, and a device accommodating unit that accommodates a device connected to the circuit substrate are integrally formed with a resin.

Description of Related Art

A resin molded body (resin case), in which the connector unit, the substrate accommodating unit, and the device accommodating unit described above are integrally molded with a resin, is proposed in the related art. As an example of this type of resin case, a resin case that includes, as configuration components of an ABS (antilock brake system) unit for vehicles, a fitting chamber to which a mating connector supplying power to the same system is fitted, a substrate accommodating unit which accommodates a circuit substrate for system control, and a device accommodating unit which accommodates a solenoid coil (device) operating a valve to open or close a hydraulic circuit, including a brake device, is given.

Specifically, one of resin cases of the related art (hereinafter, referred to as a "related art case") is formed such that a hollow portion is provided in a side wall of the device accommodating unit (for example, such that the side wall has a structure in which two plates are arranged at an interval) to prevent distortion of the resin case, which is attributable to uneven cooling at the time of molding (and uneven curing of a resin subsequent to the cooling). Therefore, the related art case offsets internal stress generated on the side wall of the device accommodating unit and prevents distortion of the side wall (for example, refer to Patent Document 1: JP-A-2013-62906).

[Patent Document 1] JP-A-2013-62906

According to a related art, an opening portion (opening portion defined by a side wall) of a device accommodating unit is closed by a lid-like member (or other members associated with operation of a device) after a device is disposed in the device accommodating unit. The member that closes the opening portion is fixed to the side wall of the device accommodating unit with a screw. The position of fixing with such a screw is provided, in general, at a position away from the hollow portion in consideration of the strength of the side wall. However, it is desirable that the position of fixing described above be not limited as much as possible from a perspective of enhancing flexibility in designing a resin molded body.

SUMMARY

One or more embodiments provide a resin molded body which can both reduce distortion when molding the resin molded body and improve flexibility in designing the resin molded body.

In an aspect (1), a resin molded body includes a connector unit having a side wall and an inner wall, both of which define a fitting chamber to which a mating connector is fitted and having a terminal penetrating through the inner wall and extending in a fitting direction, a substrate accommodating unit accommodating a circuit substrate to which the terminal is connected, and a device accommodating unit accommodating a device connected to the circuit substrate. The resin molded body is an integral molded product made of resin. A connecting portion has a plate shape extending outwards from the inner wall of the connector unit, and a second thickness thinner than a first thickness of the inner wall. The connecting portion is linked to the device accommodating unit. The inner wall has a thin wall portion in a vicinity of a connecting position where the inner wall and the connecting portion are connected to each other. The terminal penetrates without through the thin wall.

In an aspect (2), the resin molded body further includes a supporting portion having a third thickness which is equal to or thinner than the second thickness of the connecting portion and linking the device accommodating unit and the connecting portion. The device accommodating unit is opened in the same direction as the connector unit.

In an aspect (3), the inner wall has a cavity recessed in a thickness direction of the inner wall in a back surface of a surface defining the fitting chamber, in the thin wall portion.

According to the aspect (1), a difference between time required for completing the cooling of the connecting portion and time required for completing the cooling of the inner wall of the connector unit can occur when molding the resin molded body since the thickness of the connecting portion is smaller (thinner) than the thickness of the inner wall of the connector unit. Due to the difference in time required for the cooling, distortion in the resin molded body (in particular, distortion in a direction where the side wall of the connector unit approaches the connecting portion, which is attributable to the contraction in the vicinity of the position at which the inner wall and the connecting portion are connected to each other) can occur. However, in the resin molded body having the configuration, since the thin wall portion is provided in the vicinity of the position at which the inner wall and the connecting portion are connected to each other, a difference in cooling time for this vicinity becomes smaller and distortion of the resin molded body can be reduced compared to a case where there is no such a thin wall portion.

The thin wall portion described above is provided at a position away from the terminal that penetrates through the inner wall of the connector unit (that is, position which does not have an effect on the supporting of the terminal performed by the inner wall or position which minimizes the effect). Thus, even when the thin wall portion is provided, a fundamental function of the connector unit (electrical connection between the circuit substrate and the mating connector via the terminal) is not affected. In addition, since the hollow portion in the side wall of the device accommodating unit is not necessary unlike in the case of the related art, a decrease in flexibility in designing, which is attributable to such a hollow portion, does not occur.

Accordingly, the resin molded body having the configuration can both reduce distortion when molding the resin molded body and improve flexibility in designing the resin molded body.

According to the aspect (2), the device accommodating unit is opened in the same direction as the connector unit. For this reason, in a case where the same distortion described above (in particular, distortion of the device accommodating unit and the connector unit approaching each other, which occurs as a result of distortion in a direction where the side wall of the device accommodating unit and the connecting portion approach each other) occurs between the device accommodating unit and the connecting portion, there is a possibility that the mating connector interferes with the device accommodating unit and work of fitting the mating connector to the connector unit becomes difficult. However, in the resin molded body having the configuration, distortion of the device accommodating unit described above is reduced by a supporting portion (which has cooling time that is equal to or shorter than the cooling time of the connecting portion since the thickness of the supporting portion is equal to or smaller than the thickness of the connecting portion) between the device accommodating unit and the connecting portion. Accordingly, the resin molded body having the configuration can further reliably reduce distortion when molding the resin molded body.

According to the aspect (3), a cavity is provided in a back surface (outer side of the fitting chamber. In other words, the inner surface of the substrate accommodating unit) of a surface that defines the fitting chamber of the connector unit (inner surface of the fitting chamber) to provide the thin wall portion on the inner wall. Therefore, the effect of the cavity on the strength of the connector unit is smaller compared to a case where the cavity is provided in the latter surface (surface that defines the fitting chamber). For this reason, even when the cavity is provided, the deformation of the connector unit, which is caused by impact force or pressing force when fitting the mating connector to the connector unit, is avoided as much as possible. Thus, the resin molded body having the configuration can reduce distortion when molding the resin molded body while maintaining the strength of the connector unit.

Advantage of the Invention

According to one or more embodiments, a resin molded body which can both reduce distortion when molding the resin molded body and improve flexibility in designing the resin molded body can be provided.

Hereinbefore, the invention has been described in a simple manner. Details of the invention will be further clarified by reading through a mode for carrying out the invention to be described (hereinafter, referred to as an "embodiment") with reference to accompanying drawings.

DETAILED DESCRIPTION

Embodiment

Figure 1:
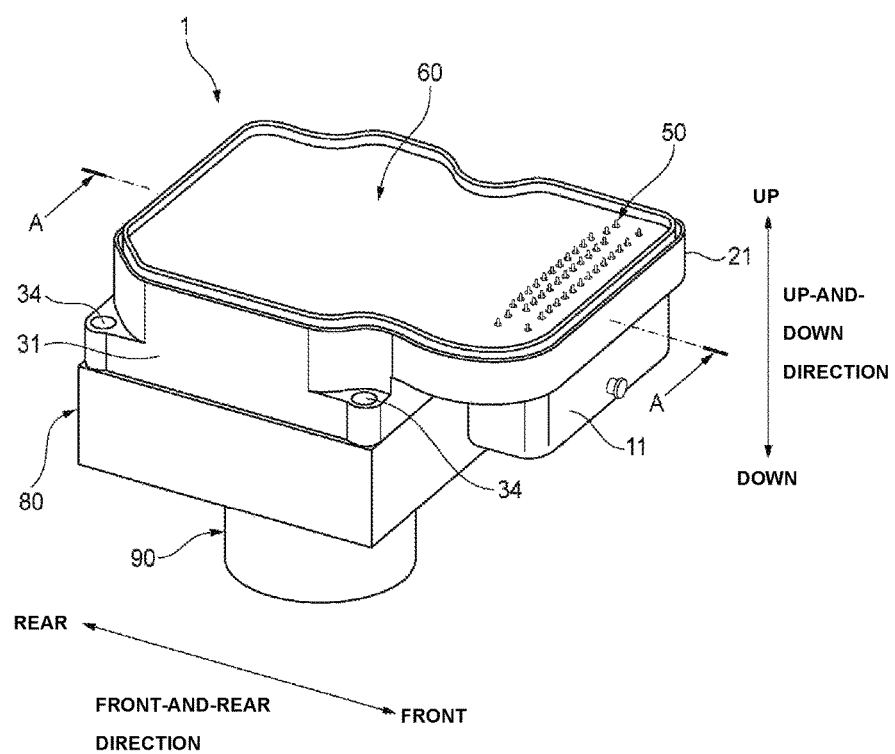
FIG. 1 is a perspective view of a resin molded body according to the embodiment, which is in a state where a circuit substrate and a device are accommodated, when seen in an upward direction.

Hereinafter, a resin molded body 1 according to an embodiment of the invention will be described with reference to the drawings.

As illustrated in FIG. 1 to FIG. 4B (in particular, FIG. 2 and FIG. 3), the resin molded body 1 is a resin molded body that integrally includes a connector unit 10, a substrate accommodating unit 20, and a device accommodating unit 30. In this example, the resin molded body 1 is used as one component of an ABS (antilock brake system) unit for vehicles. As will be described later, a circuit substrate 60 for controlling ABS is accommodated in the substrate accommodating unit 20, and solenoid coils 71 that configure hydraulic valves 70 are accommodated in the device accommodating unit 30. Hereinafter, for convenience of description, an up-and-down direction and a front-and-rear direction will be defined as illustrated in FIG. 1 to FIG. 4B. The up-and-down direction and the front-and-rear direction are orthogonal to each other.

Figure 3:
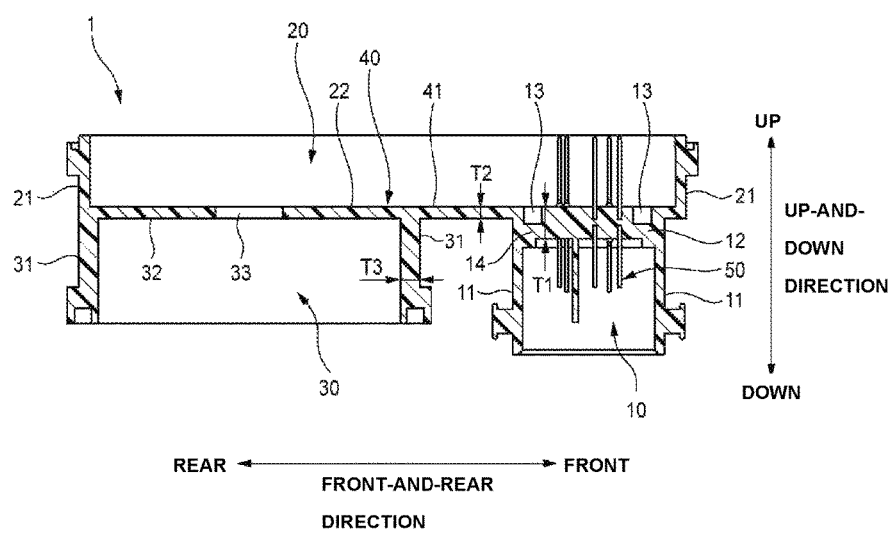
FIG. 3 is a sectional view of the resin molded body illustrated in FIG. 1, which corresponds to FIG. 2.
Figure 4A:
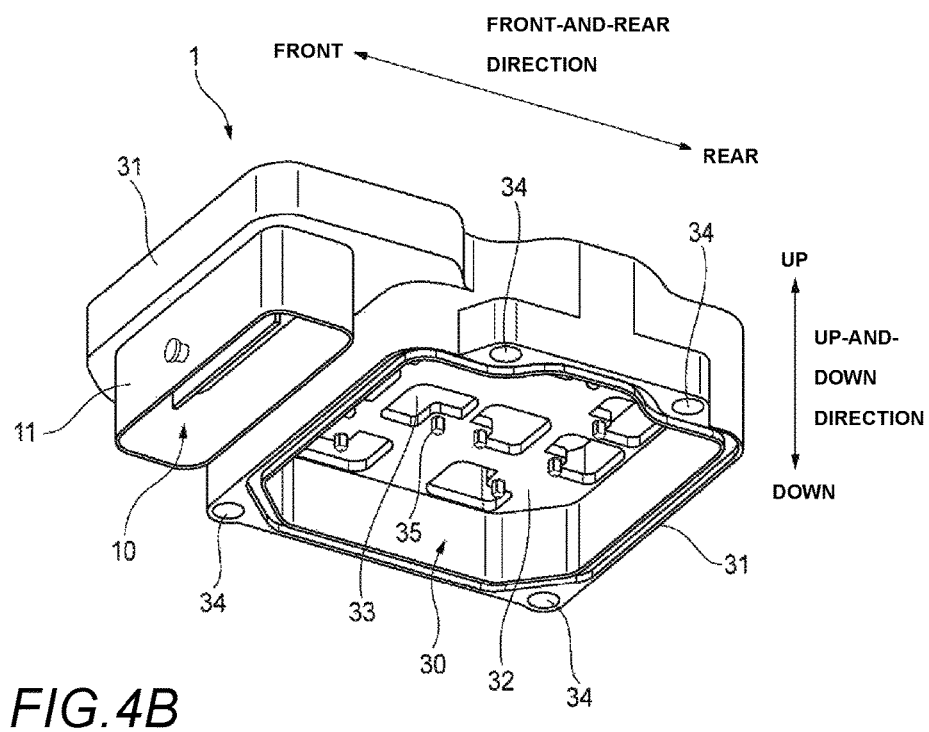
FIG. 4A is a perspective view of the resin molded body illustrated in FIG. 1 when seen in a downward direction.

As illustrated in FIG. 3, the resin molded body 1 includes a flat base plate 40 that is positioned at a substantially middle portion of the resin molded body 1 in the up-and-down direction. A substantially rectangular tubular frame (a side wall 11 of the connector unit 10. Refer to FIG. 4A), which protrudes downwards, is provided on a lower surface of a front portion of the base plate 40. A region surrounded by the side wall 11 in the base plate 40 configures an inner wall 12 of the connector unit 10.

A tubular frame (a side wall 21 of the substrate accommodating unit 20. Refer to FIG. 4A) is provided on an upper surface of a peripheral portion of the base plate 40. In other words, the base plate 40 also serves as an inner wall 22 of the substrate accommodating unit 20.

A substantially rectangular tubular frame (a side wall 31 of the device accommodating unit 30. Refer to FIG. 4A), which protrudes downwards, is provided on a lower surface of a rear portion of the base plate 40 so as to be arranged at an interval at the rear of the side wall 11. A region surrounded by the side wall 31 in the base plate 40 configures an inner wall 32 of the device accommodating unit 30.

Multiple terminals 50 that extend linearly in the up-and-down direction (in other words, a fitting direction) are pressed in and fixed to the inner wall 12 of the connector unit 10 so as to penetrate through each of multiple through-holes (not illustrated), which are provided in inner wall 12 and are penetrated in the up-and-down direction. That is, an upper end portion of each of the terminals 50 is exposed to the substrate accommodating unit 20, and a lower end portion of each of the terminals is exposed to the connector unit 10.

A thickness T1 of a portion of the base plate 40, which is corresponding to the inner wall 12, is larger than a thickness T2 of another portion of the base plate 40. That is, the thickness T1 of the inner wall 12 of the connector unit 10 is larger than the thickness T2 of the inner wall 32 of the device accommodating unit 30 and the thickness T2 of a connecting portion 41, which links the inner wall 12 and the inner wall 32 of the device accommodating unit 30 together.

In an upper surface of the inner wall 12 of the connector unit 10, an annular cavity 13 that is recessed downwards is formed at a slightly inner side position of the tubular side wall 11 and at a position away from the terminals 50. In other words, in a back surface (surface on an upper side of FIG. 3) of an inner surface (surface that defines a fitting chamber) of a fitting chamber that is defined by the side wall 11 and the inner wall 12, the cavity 13 is formed so as to be recessed in a thickness direction of the inner wall 12. Due to the cavity 13, a thin wall portion 14 of the inner wall 12 is formed at a position that is in the vicinity of a position, at which the inner wall 12 and the connecting portion 41 are connected together, and that is away from the terminals 50.

The "vicinity" described above may be a position at which there is no effect on the supporting of the terminals 50 or the effect is minimum and distortion of the resin molded body 1 attributable to a difference in cooling time, which will be described later, can be suppressed. For example, "vicinity" described above can be referred to as a position between the position at which the inner wall 12 and the connecting portion 41 are connected together and a region of the inner wall 12, through which the terminals 50 penetrate.

Each terminal insertion hole 33 (through-hole) for inserting a pair of plate spring-like terminals 73 (refer to FIG. 2), which protrude upwards from upper portions of the solenoid coils 71, is formed in a plurality of places of the inner wall 32 of the device accommodating unit 30. Although a thickness T3 of the side wall 31 of the device accommodating unit 30 is slightly larger than the thickness T2 of the connecting portion 41 in this example, the thickness T3 may be same as the thickness T2 of the connecting portion 41.

When the connector unit 10 (specifically, the fitting chamber defined by the side wall 11 and the inner wall 12) is fitted into a mating connector (not illustrated), a terminal (female terminal. Not illustrated) included in the mating connector and the terminals 50 are electrically connected to each other.

Figure 2:
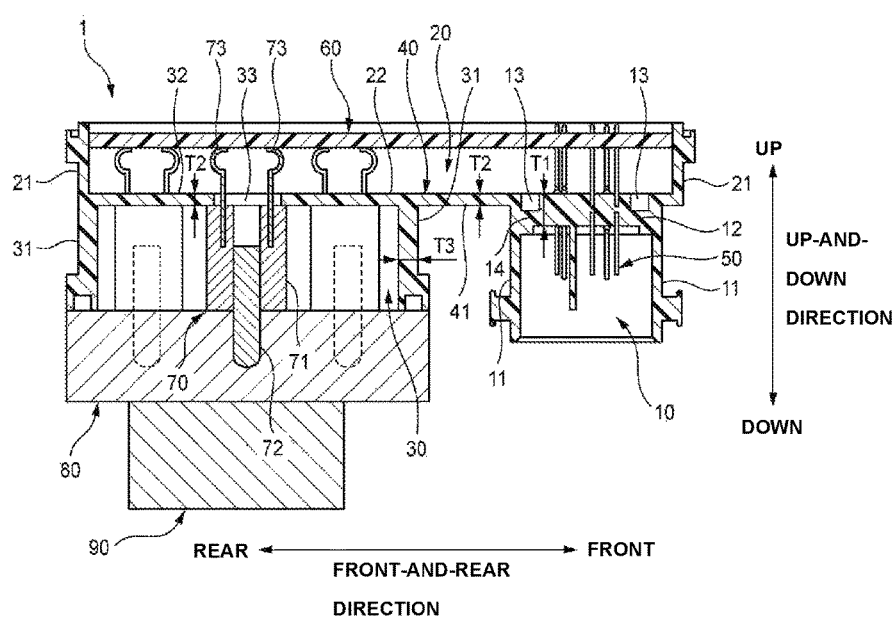
FIG. 2 is a sectional view (schematic view) taken along a line A-A of FIG. 1.

The circuit substrate 60 for controlling ABS is accommodated in and is fixed to the substrate accommodating unit 20, as illustrated in FIG. 1 and FIG. 2. In a state where the circuit substrate 60 is fixed, the upper end portions of the multiple terminals 50 are fixed to the circuit substrate 60 with the terminals penetrating through each of multiple through-holes (not illustrated), which are provided in the circuit substrate 60 and are penetrated in the up-and-down direction. As a result, each of the terminals 50 and the circuit substrate 60 are electrically connected to each other.

The plurality of solenoid coils 71 are accommodated in and are fixed to the device accommodating unit 30 such that the plate spring-like terminals 73 protruding upwards from the solenoid coils 71 pass through the terminal insertion holes 33 and are exposed to the substrate accommodating unit 20. A method for fixing the solenoid coils 71 will be described later.

Figure 7:
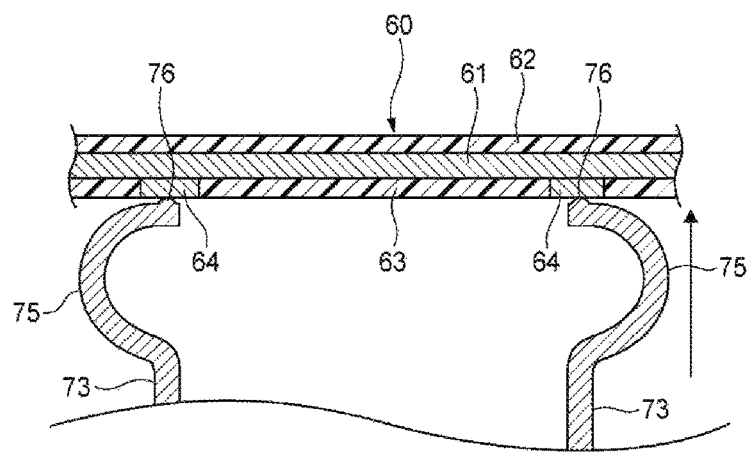
FIG. 7 is a view for describing a state where the circuit substrate and the spring portion of the plate spring-like terminal are in contact with each other.

An upper end portion of each of the plate spring-like terminals 73 exposed to the substrate accommodating unit 20 is pressed by and is in contact with the lower surface of the circuit substrate 60 (also refer to FIG. 7). As a result, each of the solenoid coils 71 is electrically connected, via the circuit substrate 60, to the mating connector that is mounted on the connector unit 10.

The solenoid coils 71 are in cylindrical shapes, and rod-like plungers 72 are accommodated in the internal spaces of the solenoid coils so as to be relatively movable with respect to the solenoid coils 71 in the up-and-down direction by means of the electromagnetic force generated by the solenoid coils 71. The solenoid coils 71 and the plungers 72 configure the hydraulic valves 70.

An actuator unit 80 for controlling ABS is mounted on a lower end surface of the side wall 31 of the device accommodating unit 30 so as to close an opening of the device accommodating unit 30. This mounting is carried out, for example, by bolt fastening with the use of a plurality of (in this example, four) bolt fastening holes (refer to FIG. 1 and FIG. 4A) provided in the side wall 31.

Although not illustrated, valve seat portions of the plurality of hydraulic valves 70 and a pump to pump up hydraulic oil stored in a reservoir are incorporated in the actuator unit 80, and a motor 90 for driving the pump is mounted on a lower surface of the actuator unit.

Lower end portions of the plungers 72 accommodated in each of the solenoid coils 71 are inserted into the valve seat portions of the hydraulic valves 70 within the actuator unit 80. By controlling up-and-down direction positions of the plungers 72 by means of the electromagnetic force generated by each of the solenoid coils 71, the opening and closing of the corresponding hydraulic valves 70 are controlled and known ABS control is executed.

To briefly describe ABS control, in a case where the slip rate of a certain wheel exceeds a predetermined value, the hydraulic valve 70 corresponding to the wheel is controlled and a brake hydraulic pressure corresponding to the wheel is decreased from a hydraulic pressure according to brake pedal effort generated by a master cylinder of a vehicle. Therefore, the slip rate of the wheel is adjusted so as to change to a value less the predetermined value. Hydraulic oil, which has returned to the reservoir when decreasing the brake hydraulic pressure, is pumped up by the pump driven by the motor 90 and returns to the master cylinder of the vehicle.

Next, the method for fixing the solenoid coils 71 to the inner wall 32 of the device accommodating unit 30 and a structure, in which the plate spring-like terminals 73 protruding from the solenoid coils 71 are pressed by and are in contact with the circuit substrate 60, will be described with reference to FIG. 4A to FIG. 7.

As illustrated in FIG. 4A, substantially cylindrical projections 35 that protrude downwards are integrally formed at positions in the vicinity of each of the plurality of terminal insertion holes 33 in a lower surface of the inner wall 32.

Figure 4B:
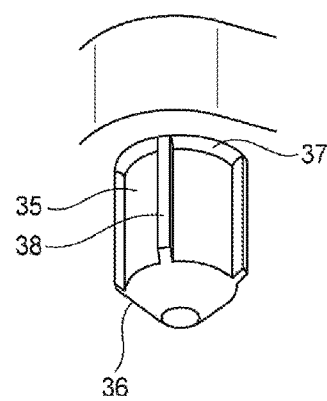
FIG. 4B is an enlarged view of a projection illustrated in FIG. 4A.

As illustrated in FIG. 4B, conical tapered portions 36, which taper to a tip, are provided on tip portions (lower end portions) of the projections 35. R-portions 37 having arc-shaped sections are provided on corners of root portions of the projections 35 over the entire circumference. A plurality of bosses 38, which protrude outwards in a diameter direction and extend in the up-and-down direction, are equidistantly and radially provided in a circumferential direction on side surfaces of the projections 35.

Figure 5A:
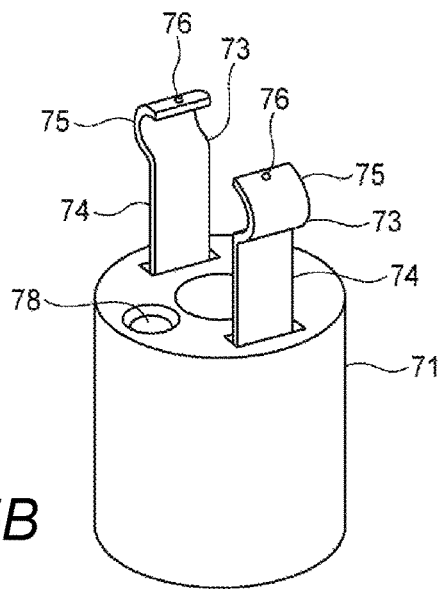
FIG. 5A is a perspective view illustrating a solenoid coil to which a plate spring-like terminal illustrated in FIG. 3 is attached.
Figure 5B:
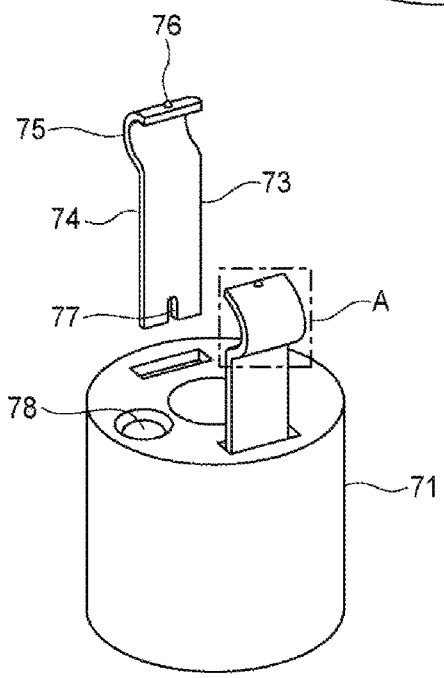
FIG. 5B is a view for describing attachment of the plate spring-like terminal to the solenoid coil.
Figure 5C:
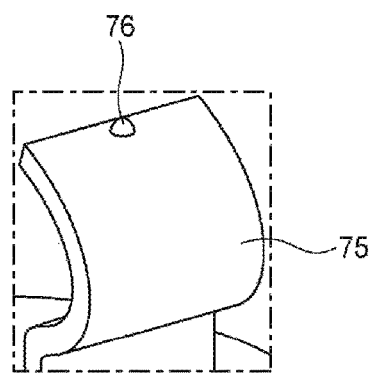
FIG. 5C is an enlarged view of a tip of a spring portion (region A in FIG. 5B) of the plate spring-like terminal.

As illustrated in FIG. 5A to FIG. 5C, the pair of plate spring-like terminals 73 is plugged in and is fixed to the upper portion of the solenoid coil 71 so as to face each other and protrude upwards. The plate spring-like terminals 73 are configured of flat plate portions 74, which are in flat plate shapes that extend in the up-and-down direction, and semi-cylindrical spring portions 75 that are continuous to upper sides of the flat plate portions 74. The flat plate portions 74 are plugged in and are fixed to the upper portions of the solenoid coils 71. The spring portions 75 are elastically deformed by upper end portions thereof receiving a load in a downward direction, thereby generating elastic force in an upward direction. In FIG. 5A to FIG. 5C, the illustration of the plungers 72 accommodated in the internal spaces (hollow portions) of the solenoid coils 71 is omitted. The same applies to FIG. 6 and FIG. 9, which will be described later.

Indent portions 76 (projection portions) that protrude upwards are provided on upper surfaces of the spring portions 75. Slits 77 that are recessed in the upward direction are formed in the lower end surfaces of the flat plate portions 74. With the use of the slits 77, the plate spring-like terminals 73 and the solenoid coils 71 are electrically connected to each other reliably. Pressing-in holes 78 for pressing the projections 35 are formed in the upper surfaces of the solenoid coils 71.

Figure 6:
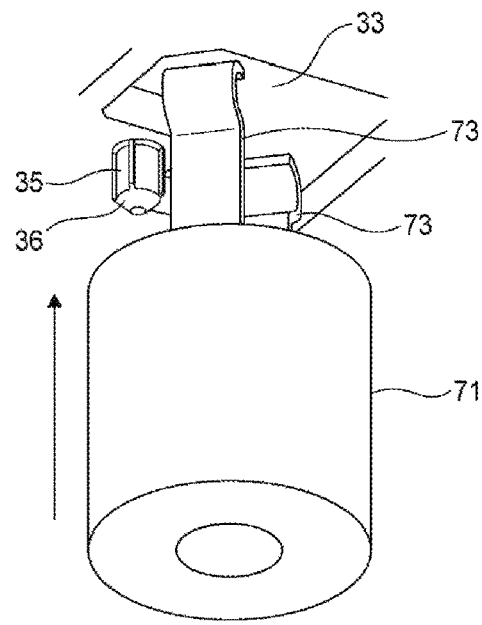
FIG. 6 is a view illustrating a state when the solenoid coil is attached to a device accommodating unit.

As illustrated in FIG. 6, the solenoid coil 71, to which the pair of plate spring-like terminals 73 is fixed, is attached to the inner wall 32 of the device accommodating unit 30 from downwards so as to fit the projection 35 into the pressing-in hole 78. When attaching the solenoid coils, the tapered portions 36 of the projections 35 fulfill a guide function of guiding the pressing-in holes 78 to the projections 35.

The diameter of an imaginary circle that passes the tip portions of the plurality of bosses 38 of the projections 35 is slightly larger than the inner diameters of the pressing-in holes 78. Thus, when the pressing-in holes 78 are fitted to the projections 35, the projections 35 are pressed into the pressing-in holes 78. Stress applied to the root portions of the projections 35 when pressing the projections in is distributed by the R-portions 37 to the periphery. By the projections 35 being pressed into and being fixed to the pressing-in holes 78 as described above, the solenoid coils 71 are reliably positioned and reliably fixed to the inner wall 32 of the device accommodating unit 30.

More specifically, when tip portions, including the tapered portions 36 of the projections 35, are inserted and pressed in the pressing-in holes 78 of the solenoid coils 71, the positioning of the plate spring-like terminals 73 and the circuit substrate 60, which is fixed to the substrate accommodating unit 20 in advance, is carried out. Next, when the projections 35 are further inserted and pressed into the pressing-in holes 78, the indent portions 76 of the plate spring-like terminals 73 abut against predetermined conductive portions (reinforcing plates 64 illustrated in FIG. 7) of the circuit substrate 60. After then, when the projections 35 are completely inserted and pressed in the pressing-in holes 78, the spring portions 75 of the pair of plate spring-like terminals 73 come into a state of being pushed downwards by the circuit substrate 60, as illustrated in FIG. 7. To realize such a state, the heights of the projections 35 protruding from the inner wall 32, the thickness of the inner wall 32, and the lengths of the plate spring-like terminals 73, a position at which the circuit substrate 60 is attached are set.

As illustrated in FIG. 7, the circuit substrate 60 has a three-layer structure in which upper and lower surfaces of a metal plate 61 are sandwiched by insulators 62 and 63. In places on the lower surface of the circuit substrate 60, which are in contact with the plate spring-like terminals 73, the insulator 63 is removed, and the conductive reinforcing plates 64 are provided on the lower surface of the exposed metal plate 61.

In a state where the spring portions 75 of the pair of plate spring-like terminals 73 are pushed by the circuit substrate 60, to be exact, by the indent portions 76 of the pair of spring portions 75 being pressed by and being brought into contact with the reinforcing plates 64 of the circuit substrate 60, the pair of spring portions 75 elastically deforms. Due to elastic force of the pair of spring portions 75 in the upward direction, which is generated with this elastic deformation, the pair of plate spring-like terminals 73 and the circuit substrate 60 are electrically connected to each other reliably, and the positional shift (sliding) of the plate spring-like terminals 73 is suppressed. By providing the reinforcing plates 64 in the circuit substrate 60, the deformation of the metal plate 61 of the circuit substrate 60, which is attributable to the elastic force of the spring portions 75, is suppressed.

In the resin molded body 1 according to the embodiment of the invention, a difference between time required for completing the cooling of the connecting portion 41 and time required for completing the cooling of the connector unit 10 can occur when molding the resin molded body 1 since the thickness T2 of the connecting portion 41 is smaller (thinner) than the thickness T1 of the inner wall of the connector unit 10. Due to the difference in time required for the cooling, distortion in the resin molded body 1 (in particular, distortion in a direction where the side wall of the connector unit 10 approaches the connecting portion 41, which is attributable to the contraction in the vicinity of the position at which the inner wall and the connecting portion 41 are connected to each other) can occur. However, in the resin molded body 1 having the configuration, since the thin wall portion 14 is provided in the vicinity of the position at which the inner wall and the connecting portion 41 are connected to each other, a difference in cooling time for this vicinity becomes smaller and distortion of the resin molded body 1 can be reduced compared to a case where there is no such a thin wall portion 14.

The thin wall portion 14 described above is provided at a position away from the terminals 50 that penetrate through the inner wall of the connector unit 10 (position which does not have an effect on the supporting of the terminals 50 performed by the inner wall 12 or position which minimizes the effect). Thus, even when the thin wall portion 14 is provided, a fundamental function of the connector unit 10 (electrical connection between the circuit substrate 60 and the mating connector via the terminals 50) is not affected. In addition, since the hollow portion in the side wall 31 of the device accommodating unit 30 is not necessary unlike in the case of the related art, a decrease in flexibility in designing, which is attributable to such a hollow portion, does not occur.

Accordingly, the resin molded body 1 can both reduce distortion when molding the resin molded body 1 and improve in flexibility in designing the resin molded body 1.

In the resin molded body 1 according to the embodiment of the invention, the device accommodating unit 30 is opened in the same direction as the connector unit 10. For this reason, in a case where the same distortion described above (in particular, distortion of the device accommodating unit 30 and the connector unit 10 approaching each other, which occurs as a result of distortion in a direction where the side wall of the device accommodating unit 30 and the connecting portion 41 approach each other) occurs between the device accommodating unit 30 and the connecting portion 41, there is a possibility that the mating connector interferes with the device accommodating unit 30 and work of fitting the mating connector to the connector unit 10 becomes difficult. However, in the resin molded body 1 having the configuration, distortion of the device accommodating unit 30 described above is reduced by a supporting portion (which has cooling time that is equal to or shorter than the cooling time of the connecting portion 41 since the thickness of the supporting portion is equal to or smaller than the thickness of the connecting portion 41) between the device accommodating unit 30 and the connecting portion 41. Accordingly, the resin molded body 1 having the configuration can further reliably reduce distortion when molding the resin molded body 1.

In the resin molded body 1 according to the embodiment of the invention, the cavity 13 is provided in the back surface (surface on the upper side of FIG. 3) of the surface that defines the fitting chamber of the connector unit 10 (for example, a surface on a lower side of FIG. 3) to provide the thin wall portion 14 on the inner wall 12. Therefore, the effect of the cavity 13 on the strength of the connector unit 10 is smaller compared to a case where the cavity 13 is provided in the latter surface (surface that defines the fitting chamber). For this reason, even when the cavity 13 is provided, the deformation of the connector unit 10, which is caused by impact force or pressing force when fitting the mating connector to the connector unit 10, is avoided as much as possible. Thus, the resin molded body 1 can reduce distortion when molding the resin molded body 1 while maintaining the strength of the connector unit 10.

In addition, to describe from a perspective of a mold for molding the resin molded body 1, a mold portion corresponding to the cavity 13 comes into a state of protruding from a mold portion corresponding to the substrate accommodating unit 20 (space where the circuit substrate 60 is accommodated), as is evident from FIG. 3. Other protruding mold portions do not exist in the periphery of the mold portion corresponding to the cavity 13. For this reason, when the cavity 13 is provided at the position described above, it becomes easier to cool the mold portion corresponding to the cavity 13 by the amount it becomes easier to dissipate heat from the mold portion corresponding to the cavity 13 to the periphery at a time when cooling the used mold, compared to a case where the cavity 13 is provided on a fitting chamber side.

Other Forms

The invention is not limited to each embodiment described above, and various modification examples can be adopted within the scope of the invention. For example, the invention can be modified and improved as appropriate without being limited to the embodiment described above. Materials, shapes, sizes, numbers, and places to be disposed of configuration elements in the embodiment described above are subject to change and are not limited insofar as the invention can be realized.

Figure 8:
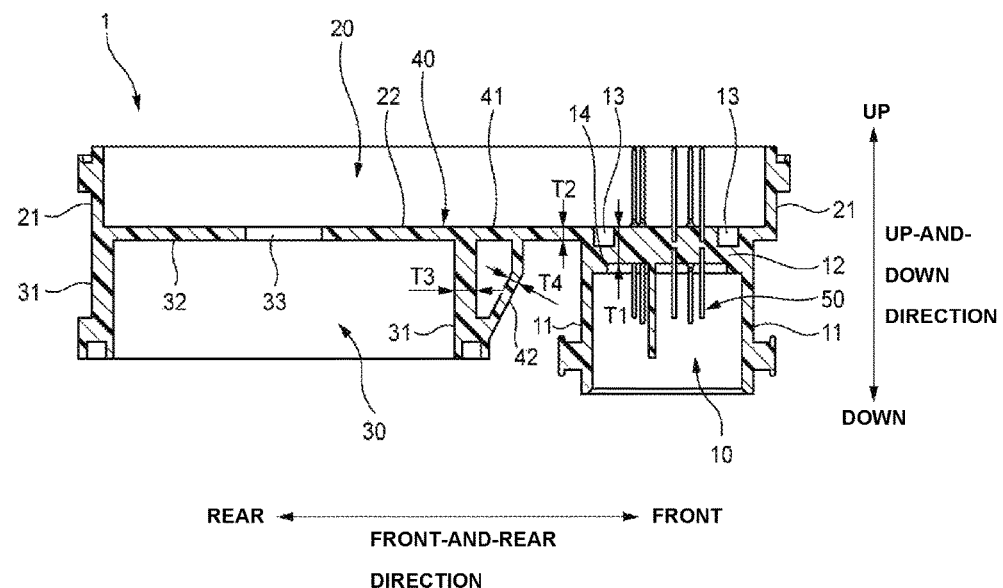
FIG. 8 is a view of a resin molded body according to a modification example of the embodiment, which corresponds to FIG. 3.

For example, as illustrated in FIG. 8, in the resin molded body 1, a rib 42 (supporting portion) that links the side wall 31 of the device accommodating unit 30 and the connecting portion 41 together may be provided. A thickness T4 of the rib 42 may be equal to or smaller than the thickness T2 of the connecting portion 41. By providing the rib 42, deformation caused by uneven curing of a resin between the device accommodating unit 30 and the connecting portion 41 can be suppressed.

Figure 9:
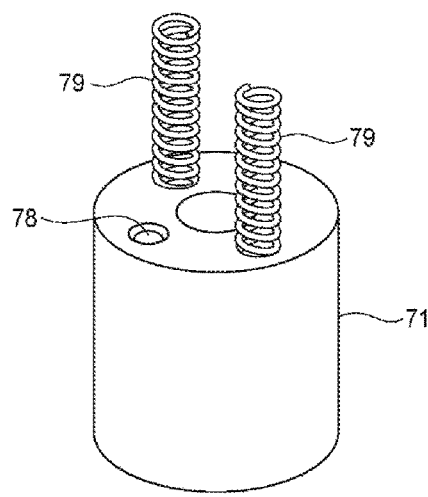
FIG. 9 is a perspective view illustrating the solenoid coil to which a coil-spring terminal is attached instead of the plate spring-like terminal.

In the embodiment, the pair of plate spring-like terminals 73 is provided as terminals of the solenoid coils 71 (refer to FIGS. 5A to 5C). However, as illustrated in FIG. 9, a pair of coil-spring terminals 79 may be provided. With the terminals as well, the same operation and effect as in the embodiment can be obtained.

Herein, each of characteristics of the embodiment of the resin molded body according to the invention described above is summarized in the following [1] to [3] in a simple manner.

[1] A resin molded body (1) comprising:
a connector unit (10) having a side wall (11) and an inner wall (12), both of which define a fitting chamber to which a mating connector is fitted, and having a terminal (50) penetrating through the inner wall and extending in a fitting direction;
a substrate accommodating unit (20) accommodating a circuit substrate (60) to which the terminal is connected; and
a device accommodating unit (30) accommodating a device (71) connected to the circuit substrate,
wherein the resin molded body is an integral molded product made of resin,
wherein a connecting portion (41) has a plate shape extending outwards from the inner wall (12) of the connector unit, and a second thickness thinner than a first thickness of the inner wall,
wherein the connecting portion is linked to the device accommodating unit (30),
wherein the inner wall (12) has a thin wall portion (14) in a vicinity of a connecting position where the inner wall (12) and the connecting portion (41) are connected to each other, and
wherein the terminal (50) penetrates without through the thin wall.

[2] The resin molded body according to the above-described [1], further comprising:
a supporting portion (42) having a third thickness which is equal to or thinner than the second thickness of the connecting portion and linking the device accommodating unit (30) and the connecting portion (41),
wherein the device accommodating unit (30) is opened in the same direction as the connector unit (10).

[3] The resin molded body according to the above-described [1] or [2],
wherein the inner wall (12) has a cavity (13) recessed in a thickness direction of the inner wall in a back surface of a surface defining the fitting chamber, in the thin wall portion (14).

DESCRIPTION OF REFERENCE NUMERALS AND SIGNS 1 resin molded body
10 connector unit
11 side wall
12 inner wall
13 cavity
14 thin wall portion
20 substrate accommodating unit
30 device accommodating unit
31 side wall
41 connecting portion
42 rib (supporting portion)
50 terminal 60 circuit substrate
71 solenoid coil (device)

What is claimed is:

1. A resin molded body comprising:
a connector unit having a plurality of side walls and an inner wall, both of which define a fitting chamber to which a mating connector is fitted, and having a terminal penetrating through the inner wall and extending in a fitting direction;
a substrate accommodating unit accommodating a circuit substrate to which the terminal is connected; and
a device accommodating unit accommodating a device connected to the circuit substrate,
wherein the resin molded body is an integral molded product made of resin,
wherein a connecting portion has a plate shape extending outwards from the inner wall of the connector unit, and a second thickness thinner than a first thickness of the inner wall,
wherein the connecting portion is linked to the device accommodating unit,
wherein the inner wall of the connector unit has a thin wall portion disposed at a position between the side walls in a vicinity of a connecting position where the inner wall and the connecting portion are connected to each other, and
wherein the terminal penetrates through the inner wall without penetrating through the thin wall portion.

2. The resin molded body according to claim 1, further comprising:
a supporting portion having a third thickness which is equal to or thinner than the second thickness of the connecting portion and linking the device accommodating unit and the connecting portion,
wherein the device accommodating unit is opened in the same direction as the connector unit.

3. The resin molded body according to claim 1,
wherein the inner wall has a cavity recessed in a thickness direction of the inner wall in a back surface defining an outer side of the fitting chamber, in the thin wall portion.

4. The resin molded body according to claim 1, wherein the thin wall portion surrounds at least a portion of the terminal penetrating through the inner wall and connected to the circuit substrate.

5. The resin molded body according to claim 1, wherein the thin wall portion is provided at a position away from the connecting portion.

* * * * *